United States Patent
Boyd, Jr. et al.

(10) Patent No.: US 9,001,489 B2
(45) Date of Patent: Apr. 7, 2015

(54) ELECTROSTATIC CHUCK ALN DIELECTRIC REPAIR

(75) Inventors: Wendell G. Boyd, Jr., Morgan Hill, CA (US); Joseph F. Sommers, San Jose, CA (US); William M. Lu, Sunnyvale, CA (US); Rajan Balesan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 13/453,606

(22) Filed: Apr. 23, 2012

(65) Prior Publication Data

US 2012/0307412 A1    Dec. 6, 2012

Related U.S. Application Data

(60) Provisional application No. 61/492,692, filed on Jun. 2, 2011.

(51) Int. Cl.
*H02N 13/00* (2006.01)
*H01L 21/683* (2006.01)
*H01L 21/687* (2006.01)

(52) U.S. Cl.
CPC ........ *H01L 21/6833* (2013.01); *H01L 21/6875* (2013.01)

(58) Field of Classification Search
USPC ........................................................ 361/234
See application file for complete search history.

(56) References Cited

U.S. PATENT DOCUMENTS

| | | | |
|---|---|---|---|
| 5,671,116 A * | 9/1997 | Husain | 361/234 |
| 5,841,193 A * | 11/1998 | Eichelberger | 257/723 |
| 6,835,415 B2 | 12/2004 | Blaedel et al. | |
| 7,480,129 B2 | 1/2009 | Brown et al. | |
| 7,589,950 B2 | 9/2009 | Parkhe et al. | |
| 7,667,944 B2 * | 2/2010 | Naim | 361/234 |
| 7,697,260 B2 | 4/2010 | Brown et al. | |
| 7,910,218 B2 | 3/2011 | Lin et al. | |
| 2004/0099285 A1 * | 5/2004 | Wang et al. | 134/8 |
| 2009/0034149 A1 | 2/2009 | Lubomirsky et al. | |
| 2009/0290145 A1 | 11/2009 | Howard et al. | |
| 2010/0061032 A1 | 3/2010 | Hirahara et al. | |
| 2010/0088872 A1 | 4/2010 | Shih | |
| 2011/0007303 A1 | 1/2011 | Howard et al. | |
| 2011/0115094 A1 * | 5/2011 | Darnon et al. | 257/774 |
| 2012/0307412 A1 * | 12/2012 | Boyd et al. | 361/234 |
| 2013/0120897 A1 * | 5/2013 | Lin et al. | 361/234 |

FOREIGN PATENT DOCUMENTS

KR    2009-0071848 A    7/2009
WO    WO 2010132640 A2 *    11/2010

OTHER PUBLICATIONS

International Search Report and Written Opinion for PCT/US2012/033817 dated Oct. 4, 2012.

* cited by examiner

*Primary Examiner* — Ronald W Leja
(74) *Attorney, Agent, or Firm* — Patterson & Sheridan, LLP

(57) ABSTRACT

The present invention generally relates to a refurbished electrostatic chuck and a method of refurbishing a used electrostatic chuck. Initially, a predetermined amount of dielectric material is removed from the used electrostatic chuck to leave a base surface. Then, the base surface is roughened to enhance the adherence of new dielectric material thereto. The new dielectric material is then sprayed onto the roughened surface. A mask is then placed over the new dielectric material to aid in the formation of mesas upon which a substrate will sit during processing. A portion of the new dielectric layer is then removed to form new mesas. After removing the mask, edges of the mesas may be smoothed and the refurbished electrostatic chuck is ready to return to service after cleaning.

16 Claims, 4 Drawing Sheets

ELECTROSTATIC CHUCK ALN DIELECTRIC REPAIR

CROSS-REFERENCE TO RELATED APPLICATIONS

This application claims benefit of U.S. Provisional Patent Application Ser. No. 61/492,692, filed Jun. 2, 2011, which is herein incorporated by reference.

BACKGROUND OF THE INVENTION

1. Field of the Invention

Embodiments of the present invention generally relate to a refurbished electrostatic chuck and a method for refurbishing an electrostatic chuck.

2. Description of the Related Art

Electrostatic chucks are useful in the manufacture of semiconductor devices. The electrostatic chuck permits that substrate to remain in a fixed location on the electrostatic chuck during processing by electrostatically clamping the substrate to the chuck.

The electrostatic chuck typically has an electrode embedded within a dielectric material. The topmost surface of the electrostatic chuck has a plurality of mesas upon which the substrate will sit during processing. Over time, the mesas may wear down and the electrostatic chuck will not be as effective. Additionally, the electrical properties the electrostatic chuck may be jeopardized by a crack in the dielectric material or the dielectric material may be compromised by a chemical or plasma attack causing the dielectric material to breakdown.

When the mesas wear down, a crack forms in the dielectric material or the dielectric material breaks down, the electrostatic chuck is no longer useful and is typically discarded. It would be beneficial to refurbish the electrostatic chuck to avoid the expense of purchasing a new electrostatic chuck.

SUMMARY OF THE INVENTION

The present invention generally relates to a refurbished electrostatic chuck and a method of refurbishing a used electrostatic chuck. Initially, a predetermined amount of dielectric material is removed from the used electrostatic chuck to leave a base surface. Then, the base surface is roughened to enhance the adherence of new dielectric material thereto. The new dielectric material is then sprayed onto the roughened surface. A mask is then placed over the new dielectric material to aid in the formation of mesas upon which a substrate will sit during processing. A portion of the new dielectric layer is then removed to form new mesas. After removing the mask, edges of the mesas may be smoothed and the refurbished electrostatic chuck is ready to return to service after cleaning.

In one embodiment, a method for refurbishing an electrostatic chuck includes measuring a depth of an electrode below an upper surface of an electrostatic chuck, determining a thickness of a portion of the electrostatic chuck to be removed in response to the measured depth and removing the portion of the electrostatic chuck to expose a base surface. The method also includes roughening the base surface, plasma spraying dielectric material onto the roughened base surface to form a dielectric layer of sprayed material on the base surface and compressing the dielectric layer of sprayed material. The method additionally includes selectively removing material from the compressed dielectric layer of sprayed material to establish a new upper surface and polishing the new upper surface.

In another embodiment, a method for refurbishing an electrostatic chuck is disclosed. The method includes measuring a depth of an electrode below a top surface of an electrostatic chuck body, determining a thickness of a portion of the electrostatic chuck body to be removed in response to the measured depth, removing the portion of the electrostatic chuck body to expose a base surface, roughening the base surface and disposing dielectric material onto the roughened base surface to form a dielectric layer on the base surface.

In another embodiment, a refurbished electrostatic chuck includes a chuck body having one or more electrodes and one or more first dielectric layers disposed thereover and a second dielectric layer disposed over the one or more first dielectric layers. The second dielectric layer has a top surface that has a plurality of mesas extending therefrom in a direction away from the one or more first dielectric layers. The second dielectric layer and the one or more first dielectric layers are distinct layers.

In another embodiment, a refurbished electrostatic chuck includes a multi-layer electrostatic chuck body, wherein a first layer of the multi-layer electrostatic chuck body has one or more electrodes embedded thereon, wherein a second layer of the multi-layer electrostatic chuck body is selected from the group consisting of a sintered dielectric layer and a dielectric layer bonded to the first layer with an adhesive, wherein the second layer has a top surface that has a plurality of mesas extending therefrom in a direction away from the first layer and wherein the second layer and the first layers are distinct layers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a refurbished electrostatic chuck and a method of refurbishing a used electrostatic chuck. Suitable electrostatic chucks that may be refurbished according to the embodiments discussed herein include Johnson-Rahbeck electrostatic chucks available from Applied Materials, Inc., Santa Clara, Calif. It is to be understood that the embodiments discussed herein are equally applicable to other types of electrostatic chucks, including those available from other manufacturers.

Figure 1A:
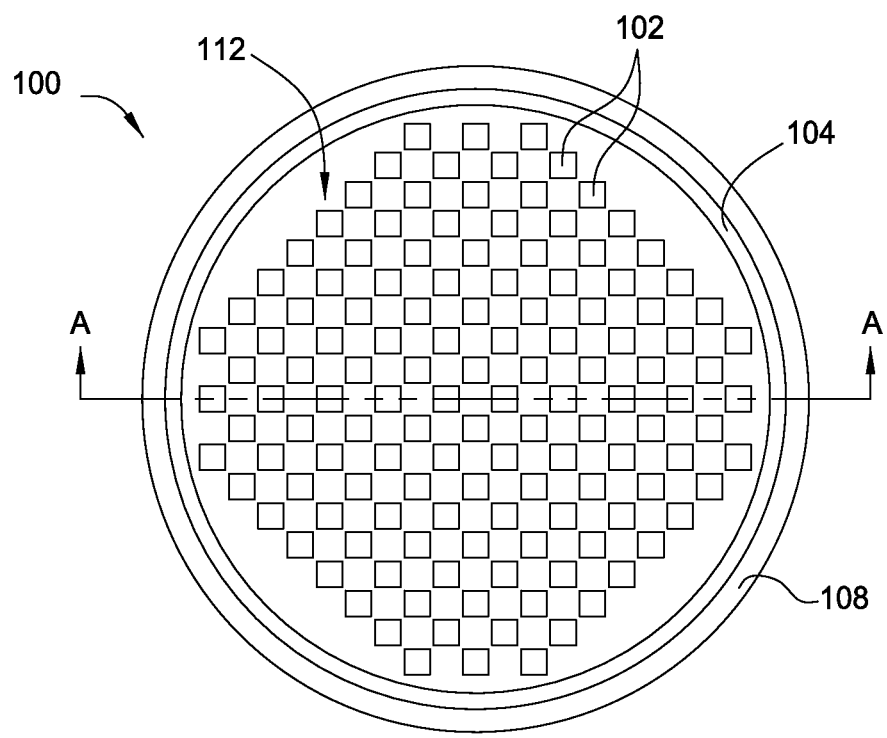
FIG. 1A is a schematic top view of a used electrostatic chuck prior to refurbishment.
Figure 1B:
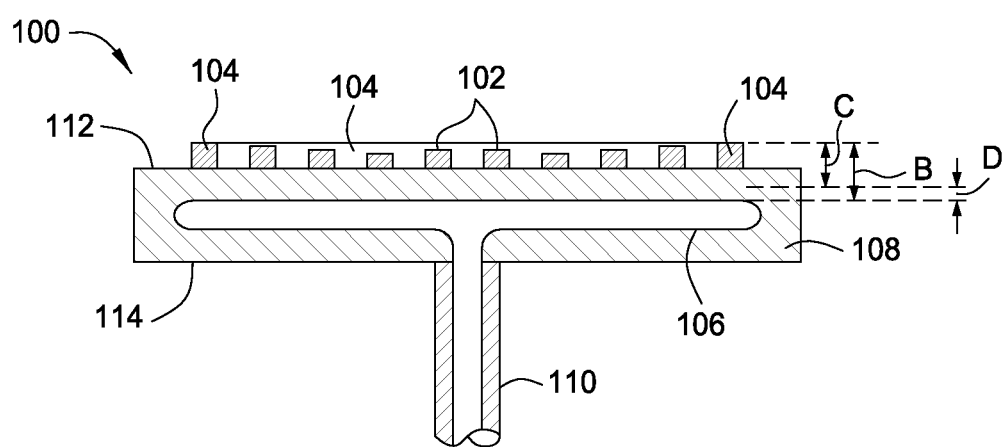
FIG. 1B is a cross-sectional view of the used electrostatic chuck of FIG. 1A.

FIG. 1A is a schematic top view of a used Johnson-Rahbeck type electrostatic chuck 100 prior to refurbishment. FIG. 1B is a cross-sectional view of the used electrostatic chuck 100 of FIG. 1A. The electrostatic chuck 100 has a chuck body 108 that includes a top surface 112 and a bottom surface 114. The top surface 112 includes a plurality of mesas 102 extending from the chuck body 108 of the electrostatic chuck 100. The chuck body 108 may have one or more dielectric layers. In the embodiment shown in FIGS. 1A and 1B, the chuck body 108 comprises a single dielectric layer. The chuck body 108 comprises a ceramic material such as aluminum nitride, however, it is to be understood that the refurbishment method discussed herein is applicable to electrostatic chucks comprising other dielectric materials. A gas retention ring 104 extends from the top surface 112 and encircles the area where the mesas 102 are disposed. Both the mesas 102 and the gas retention ring 104 comprise the same dielectric material as the chuck body 108. Embedded within the chuck body 108 is an electrode 106 that couples to a power source through a stem 110 coupled to the bottom surface 114 of the electrostatic chuck 100.

As shown in FIG. 1B, the mesas 102 each extend a different height above the chuck body 108. Therefore, any substrate disposed on the electrostatic chuck 100 may not be held substantially flat due to the uneven height of the mesas 102. Additionally, the uneven mesas 102 may prevent a substrate disposed on the electrostatic chuck 100 from being uniformly chucked, which may affect the uniformity of the processing on the substrate.

In order to refurbish the electrostatic chuck 100, an amount of material to be removed needs to be determined. A distance, shown by arrow "B", between the electrode 106 and the highest point of the mesas 102 or gas retention ring 104 is determined by measuring the capacitance of the electrostatic chuck 100. A predefined amount of material, shown by arrow "D" is desired to remain over the electrode 106 after the material is removed to prevent accidental exposure of the electrode 106. Thus, the amount of material to be removed, shown by distance "C", may be determined by subtracting distance "D" from distance "B".

Figure 2:
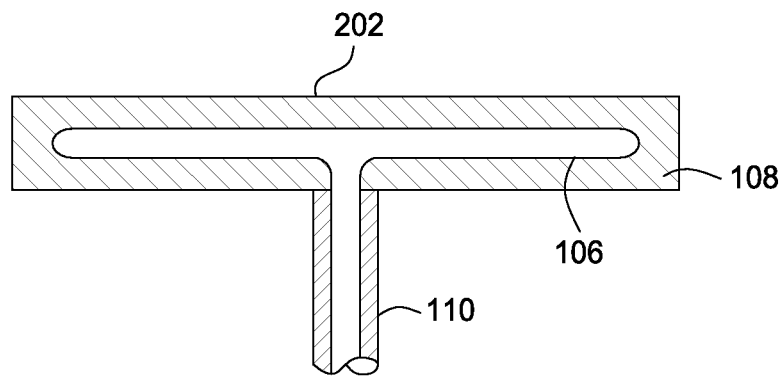
FIGS. 2-7 are cross-sectional views of the electrostatic chuck of FIGS. 1A and 1B at various stages of refurbishment according to one embodiment.

Once the amount of material to remove is determined, the electrostatic chuck 100 is then lapped and polished to remove the mesas 102, gas retention ring 104 and additional material of the chuck body 108 to leave a base surface 202, as shown in FIG. 2, which is the distance "D" above the electrode 106. The distance "D" may be between about 20 microns to about 25 microns from the electrode 106. The lapping removes the bulk of the material while the polishing smoothes the surface 202. In one embodiment, lapping removes the material at a rate of between about 1 micrometers per minute to about 150 micrometers per minute, depending on the diamond size within the slurry. In one embodiment, the slurry diamond size is between about 0.05 microns to about 100 microns. It is to be understood that the slurry diamond size may be tailored to meet the desired removal rate. Lapping is beneficial for removing the material because lapping can be controlled to within 1 microns and produce as uniformly smooth a base surface 202 as possible. Other removal techniques, such as bead blasting or etching, would not be appropriate as bead blasting and etching cannot be controlled as well as lapping.

Figure 3:
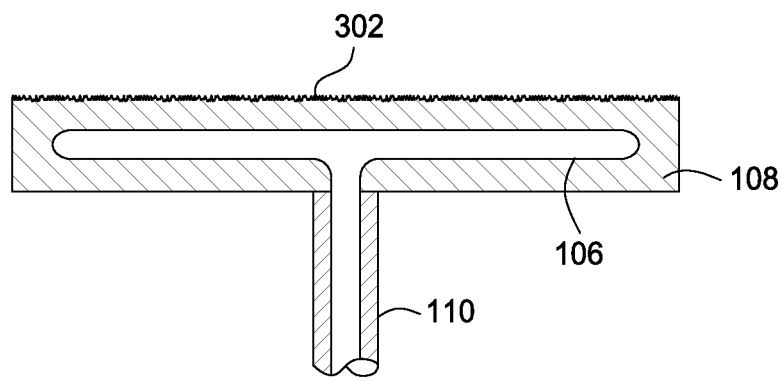

To enhance adhering new dielectric material to the smooth base surface 202, the base surface 202 may be roughened. For example, the base surface 202 may be roughened to a surface roughness of between about 50 microinches to about 300 microinches, which results in roughened surface 302 as shown in FIG. 3. In one embodiment, the base surface 202 is roughened by bead blasting.

Figure 4:
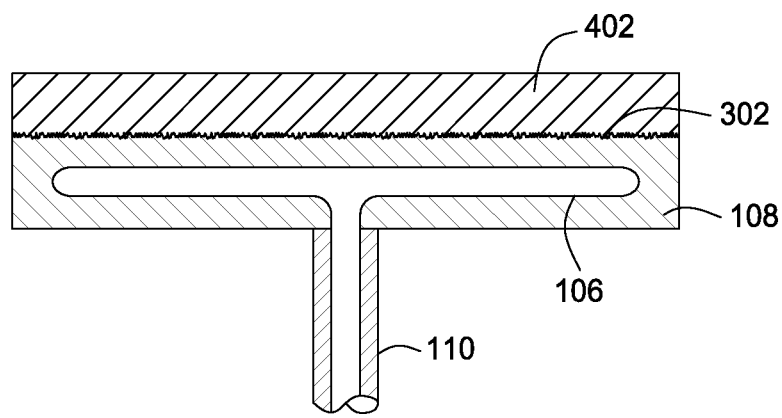

After the roughened surface 302 is formed, the new dielectric material 402 may be deposited as shown in FIG. 4. In one embodiment, the new dielectric material 402 is thermal plasma spray coated onto the roughened surface 302. Most deposition processes are conformal deposition processes that replicate the surface upon which the deposition occurs. The thermal plasma spraying process is a process that achieves a non-conformal coating (i.e., the upper surface of the new coating does not replicate the roughened surface 302). Because of the thermal plasma spraying process, the mesas and gas retention ring to be formed later can have the desired embossment profile that reduces substrate or silicon damage and backside particles. To determine the suitable material for spray coating, the resistivity of the original dielectric material is measured and then the suitable material is selected to be both sprayable and as close to the resistivity of the original dielectric material as possible. Suitable dielectric materials that may be used include aluminum nitride powder. The dielectric material may be mixed with a dopant such as yttria, alumina, titanium oxide, samarium oxide, and combinations thereof. Once the appropriate material is selected for the Johnson-Rahbeck electrostatic chuck, the new dielectric material 402 is spray coated into the roughened surface 302.

Because the new dielectric material 402 is spray coated, the grains are loosely packed. Therefore, the electrostatic chuck 100 is placed into a high pressure, inert gas environment to compress the grains so that there is less space between the grains. A suitable pressure for the compression is an environment at a pressure of greater than about 1 Torr.

Figure 5:
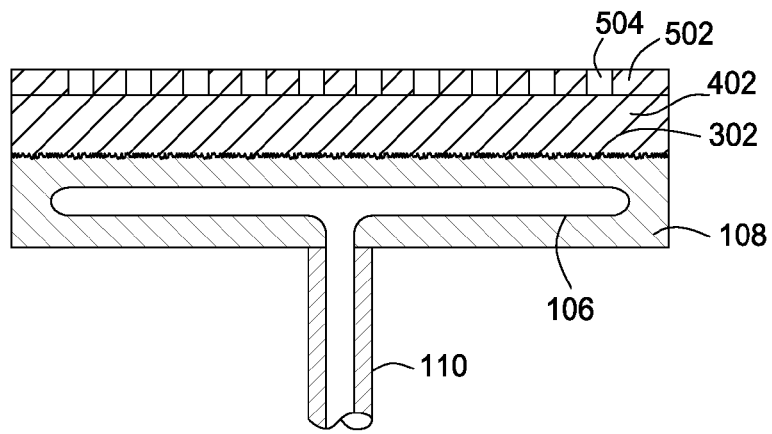
Figure 6:
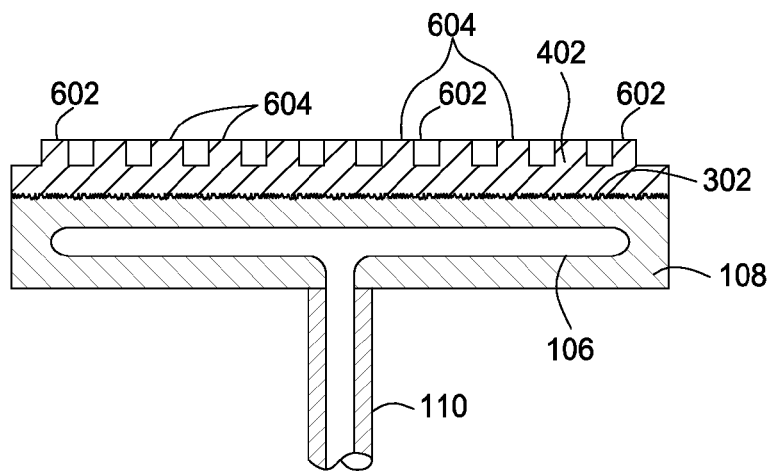

Next, the mesas and gas retention ring are formed. To form the mesas and gas retention ring, portions of the new dielectric material 402 are selectively removed. To selectively remove portions of the new dielectric material 402, a mask 502 is placed over the new dielectric material 402 as shown in FIG. 5. During the process of forming the mesas 604 and gas retention ring 602, gas grooves, embossments and other geometries may be formed as desired. The mask 502 has openings 504 that correspond to the areas adjacent to the location where the mesas and gas retention ring will be formed. The exposed new dielectric material 402 is then bead blasted through the openings 504 formed through the mask 502. The mask 502 is removed to leave the newly formed mesas 604 and gas retention ring 602, as shown in FIG. 6.

Figure 7:
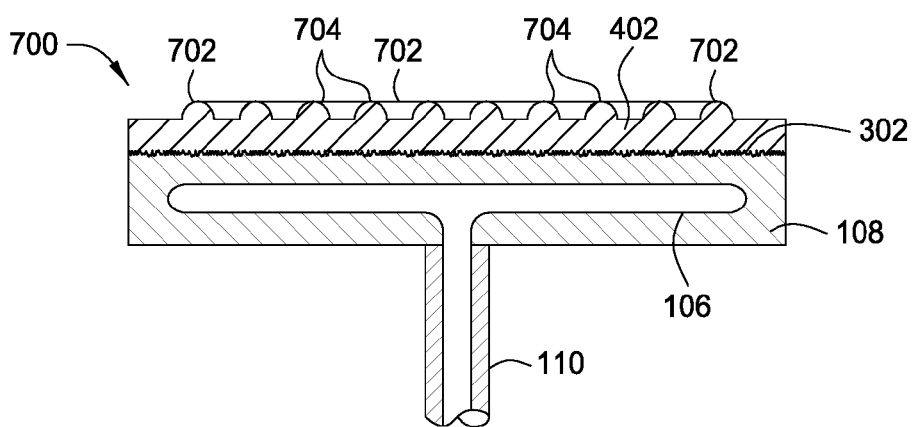

The mesas 604 and gas retention ring 602 may have sharp edges or burrs that may scratch the back of the substrate during processing and create undesired particles. Therefore, the mesas 604 and gas retention ring 602 may be polished with a soft polishing pad under minimum force to round the sharp corners, to remove the burrs and to leave the finished mesas 704 and retention ring 702 as shown in FIG. 7. Thus, the refurbished electrostatic chuck 700 is again ready for operation.

Figure 8:
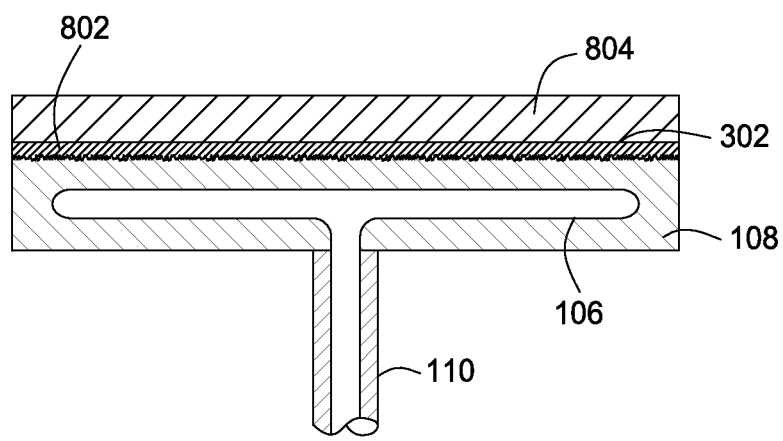
FIG. 8 is a cross-sectional view of the electrostatic chuck of FIGS. 1A and 1B at various stages of refurbishment according to another embodiment.

FIG. 8 is a cross-sectional view of the electrostatic chuck of FIGS. 1A and 1B at various stages of refurbishment according to another embodiment. Rather than spray coat a dielectric layer onto the roughened surface 302, a puck 802 of dielectric material may be bonded to the roughened surface 302 by an adhesive layer 804. As above, suitable dielectric materials that may be used include aluminum nitride powder. The dielectric material may be mixed with a dopant such as yttria, alumina, titanium oxide, samarium oxide, and combinations thereof. Suitable materials for the adhesive layer consist of a vacuum epoxy with additives to control the resistivity and decay or discharge such as aluminum oxide, titanium oxide, tantalum oxide, samarium oxide, and combinations thereof. Once the puck 802 is adhered to the roughened surface 302, the mesas are formed as discussed above with regards to FIGS. 5-7. The puck 802 need not be sintered because the grains of the puck are already closely packed.

The refurbished electrostatic chuck 700 comprises the original chuck body 108 having the electrode 106 embedded therein and a new dielectric material 402 disposed thereover with a top surface that has a plurality of mesas 704 extending in a direction away from the original chuck body 108. Thus, the refurbished electrostatic chuck 700 includes multiple dielectric layers. The refurbished electrostatic chuck 700 thus has distinct portions, namely, the original chuck body 108 and the new dielectric material 402. Both the original chuck body 108 and the new dielectric material 402 may comprise the same material such as aluminum nitride. Additionally, the new dielectric material 402 may have a dopant such as yttria, alumina, titanium oxide, samarium oxide, or combinations thereof.

By refurbishing the electrostatic chuck, there is no need to purchase an entirely new electrostatic chuck. The refurbished electrostatic chuck will cost less than the new electrostatic chuck, yet have essentially the same resistivity and function substantially identical as the new electrostatic chuck.

While the foregoing is directed to embodiments of the present invention, other and further embodiments of the invention may be devised without departing from the basic scope thereof, and the scope thereof is determined by the claims that follow.

The invention claimed is:

1. A method for refurbishing an electrostatic chuck, comprising:
measuring a depth of an electrode below a top surface of an electrostatic chuck body;
determining a thickness of a portion of the electrostatic chuck body to be removed in response to the measured depth;
removing the portion of the electrostatic chuck body to expose a base surface;
roughening the base surface;
plasma spraying dielectric material onto the roughened base surface to form a dielectric layer of sprayed material on the base surface;
compressing the dielectric layer of sprayed material; and
selectively removing material from the compressed dielectric layer of sprayed material to establish a new upper surface.

2. The method of claim 1, wherein removing the portion of the electrostatic chuck body to expose the base surface comprises performing a lapping process on the top surface.

3. The method of claim 2, wherein roughening the base surface comprises bead blasting the base surface.

4. The method of claim 3, wherein the roughened base surface has a surface roughness of between about 50 micro inches and about 300 micro inches.

5. The method of claim 4, wherein removing the portion of the electrostatic chuck body to expose the base surface comprises leaving about 20 microns to about 25 microns of electrostatic chuck body between the base surface and the electrode.

6. The method of claim 5, wherein compressing the dielectric layer of sprayed material comprises exposing the dielectric layer of sprayed material to a pressure of greater than about 1 Torr.

7. The method of claim 6, selectively removing material from the compressed dielectric layer of sprayed material to establish the new upper surface comprises:
forming a mask over the compressed dielectric layer of sprayed material; and
bead blasting the compressed dielectric layer of sprayed material exposed through the mask to form mesas.

8. The method of claim 7, further comprising polishing the new upper surface, wherein polishing the new upper surface comprises removing burrs from the mesas.

9. The method of claim 1, wherein dielectric layer of sprayed material comprises aluminum nitride.

10. The method of claim 9, wherein the dielectric layer of sprayed material additionally comprises yttria, alumina, titanium oxide, samarium oxide or combinations thereof.

11. The method of claim 1, wherein measuring the depth of the electrode below the upper surface of the electrostatic chuck comprises measuring a capacitance of the electrostatic chuck body between the electrode and the top surface.

12. A refurbished electrostatic chuck refurbished by the process of claim 1.

13. A method for refurbishing an electrostatic chuck, comprising:
measuring a depth of an electrode below a top surface of an electrostatic chuck body;
determining a thickness of a portion of the electrostatic chuck body to be removed in response to the measured depth;
removing the portion of the electrostatic chuck body to expose a base surface;
roughening the base surface;
disposing dielectric material over the roughened base surface to form a dielectric layer over the base surface; and
compressing the dielectric layer to form a compressed dielectric layer.

14. The method of claim 13, further comprising:
placing a layer of adhesive material on the roughened base surface;
disposing the dielectric material on the layer of adhesive material; and
selectively removing material from the dielectric layer to establish a new upper surface.

15. The method of claim 13, wherein removing the portion of the electrostatic chuck body to expose the base surface comprises leaving about 20 microns to about 25 microns of material between the base surface and the electrode.

16. The method of claim 14, wherein selectively removing material from the compressed dielectric layer to establish the new upper surface comprises:
forming a mask over the compressed dielectric layer; and
bead blasting the compressed dielectric layer exposed through openings formed through the mask to form mesas.

* * * * *